(12) United States Patent
Ingoldby

(10) Patent No.: US 7,404,120 B1
(45) Date of Patent: Jul. 22, 2008

(54) VERIFICATION OF EVENT HANDLING

(75) Inventor: Michael George Ingoldby, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 590 days.

(21) Appl. No.: 11/200,614

(22) Filed: Aug. 10, 2005

(51) Int. Cl.
G01R 31/28 (2006.01)
G06F 11/00 (2006.01)

(52) U.S. Cl. .................................. 714/724; 714/25

(58) Field of Classification Search ............ None
See application file for complete search history.

(56) References Cited

U.S. PATENT DOCUMENTS 5,905,883 A * 5/1999 Kasuya ............... 703/17
7,234,093 B2 * 6/2007 Kadkade .............. 714/741
7,234,094 B2 * 6/2007 Kadkade et al. ......... 714/744

* cited by examiner

Primary Examiner—Christine T Tu
(74) Attorney, Agent, or Firm—Kevin Cuenot

(57) ABSTRACT

A method of verifying event handling for a device under test comprised of hardware description language logic within a verification environment can include, for each trigger specified by the verification environment, creating an associated thread within the verification environment. The method also can include defining a time span during which event handling within a device under test is to be performed responsive to each trigger and determining whether event handling for each trigger is performed within the time span associated with that trigger. Event handling for each trigger can be monitored by the thread associated with that trigger. The method further can include indicating triggers that were not handled by the device under test.

20 Claims, 3 Drawing Sheets

VERIFICATION OF EVENT HANDLING

BACKGROUND

1. Field of the Invention

The present invention relates to the field of integrated circuits and, more particularly, to testing and verification of integrated circuit designs.

2. Description of the Related Art

Modern integrated circuits (ICs) are developed through the use of hardware description languages (HDLs). HDLs, such as VERILOG, VHDL, and the like, allow developers to create software-based representations of circuit designs. One advantage of using an HDL is the potential for code reuse from one design to another. This concept has been realized with the commercial availability of intellectual property (IP) cores. In general, an IP core refers to a software representation of a semiconductor, or a portion of a semiconductor, that provides a processing function.

Before HDL logic is made available for commercial use, it must be thoroughly tested and verified. The HDL logic must be tested to ensure that it functions properly and as expected, particularly as defined in the design specification. Typically, this testing is performed using a verification environment such as a testbench. A verification environment is comprised of HDL descriptions, which specify and verify the behavior of a device under test (DUT), as well as an HDL simulator, which executes the HDL descriptions. In this case, the DUT is HDL logic such as one or more IP cores. The verification environment can specify the connections, events, and input signals for different combinations of transactions involving the DUT. In general, the verification environment provides a pre-determined input sequence to the DUT and observes the response, or output from the DUT.

One function that must be adequately tested is the ability to generate interrupt signals. The use of interrupt signals allows the device intended to receive such signals, referred to as the target device, to continue processing data until such time that an interrupt signal is received from a sending device. The target device is relieved from having to continually poll the sending device for error conditions. Within a given device, there may be many different types of events which cause an interrupt signal to be generated. Most devices, however, have a single interrupt pin, and as such, generate a single interrupt signal. A status register commonly is provided which outputs additional information as to the reason why the interrupt was generated. The target device can access the status register upon receiving an interrupt signal to determine the cause of the interrupt signal. In any case, to test this capability, the verification environment must ensure that the DUT generates an interrupt signal under the proper circumstances.

Many modern devices have an architecture that is pipelined to some degree. Though pipelining can provide computational efficiencies, it also can create a situation in which a delay occurs between the time data is written to a device and the time the data is processed within the device. Predicting these latencies is difficult as the insertion of first-in-first-out memories (FIFOs) between processing stages, or pipelines, within the device makes the latencies non-deterministic with respect to the data input. When throttling is used, it becomes even more difficult to predict latencies. This, in turn, makes it difficult to determine the relationship between the time a trigger is introduced into the DUT, which causes an event requiring event handling, and the activation of the interrupt signal in response to the trigger.

As used herein, the term "throttling" refers to the regulation of inputs from the verification environment to the DUT. The term is derived from an analogy between the regulation of data provided to a DUT and the regulation of fuel provided to a vehicle, i.e. using the throttle. In illustration, input to the DUT can be provided at "full throttle", with no delay between inputs, or with a scaled back throttle such that some amount of time delay is introduced between inputs depending upon the degree of throttling introduced by the verification environment. When sufficient time is included between inputs, a stall condition can arise where one processing stage of the DUT is dormant while awaiting new input for processing.

Further complicating the evaluation of event handling, the resolution of an event can take more than one clock cycle. During testing, this can create a situation in which a DUT generates an interrupt signal responsive to a trigger input. The interrupt signal remains high while the event is handled. Before the event is completely handled and the interrupt signal is returned to a low state, another trigger may be provided to the DUT, causing the DUT to generate a second interrupt signal. In consequence, the interrupt signal remains continuously high. It is unclear, however, when the interrupt signal is flagged in response to the second trigger. As a result, multiple events can be flagged or marked by a single interrupt signal.

In illustration, FIG. 1 is a signaling graph depicting an interaction between a verification environment and a DUT involving several different trigger conditions. The signaling graph illustrates a scenario in which two different triggers, triggers 1 and 2, are introduced into the DUT at known times by the verification environment. The external throttling graph line indicates that a minimal amount of throttling has been introduced between the occurrence of trigger 2 and the time the DUT activates the interrupt signal. In terms of testing and/or verification, the verification environment is aware that two different trigger conditions have been introduced into the DUT.

Though FIG. 1 indicates that the interrupt signal was triggered by the DUT, there is no indication as to whether the interrupt signal was flagged responsive to trigger 1 or trigger 2. The non-deterministic nature of the DUT can make evaluations difficult. Further, assuming that an analysis of the test data does reveal that trigger 1 was the cause of the interrupt signal being activated at time T, FIG. 1 does not indicate when trigger 2 was signaled at some point after time T. Determining the portion of the interrupt signal that is attributable to each trigger is a difficult task for conventional testing and/or verification techniques, which tend to be single-threaded in nature.

FIG. 2 is a signaling graph illustrating another interaction between a verification environment and a DUT in which several triggers of a same type are introduced over a short interval. As shown, the external throttling indicates that the DUT is stalled three times with the third stall being longer in duration than the others. Through analysis of the test results, it may be possible to determine that trigger 1A caused the event handling indicated by the interrupt signal. Still, using conventional verification techniques, it is difficult to determine whether trigger 1B or trigger 1C was handled.

It would be beneficial to provide a technique for verifying event handling which overcomes the limitations described above.

SUMMARY OF THE INVENTION

The present invention provides methods relating to verifying event handling within a device under test (DUT). One embodiment of the present invention can include a method of verifying event handling for a DUT comprised of hardware description language logic within a verification environment. The method can include, for each trigger specified by the verification environment, creating an associated thread within the verification environment. A time span during which event handling within a DUT is to be performed responsive to each trigger can be identified. The method also can include determining whether event handling for each trigger is performed within the time span associated with that trigger and indicating triggers that were not handled by the device under test. Event handling for each trigger can be monitored by the thread associated with that trigger.

The method also can include identifying a time when each trigger is introduced into the DUT. Each time span can be calculated according to the time when the associated trigger is introduced into the DUT. The time spans can be adjusted to accommodate external throttling introduced into the DUT by the verification environment. The determining step can include judging whether an interrupt signal is generated during the time span for each trigger as well as judging whether a status register associated with the interrupt signal provides valid data.

The method also can include determining an average amount of time between the introduction of triggers to the DUT and the start of event handling implemented responsive to the triggers, and identifying event handling, implemented responsive to a trigger, which begins more than a minimum amount of time before or after the average amount of time as measured from the introduction of the trigger to the DUT.

Another embodiment of the present invention can include a method of verifying event handling for a DUT within a verification environment. The method can include creating a thread of execution within the verification environment corresponding to a trigger, recording a time when the trigger is provided to the DUT, and monitoring the device under test, via the thread of execution, during a window of time associated with the trigger. The window of time can be calculated according to the time the trigger is provided to the DUT. A determination can be made as to whether an event caused by the trigger within the DUT is handled during the window of time.

The method can include indicating whether the event caused by the trigger was handled within the window of time. If a stalled processing stage within the DUT is identified prior to a start of the window of time, the monitoring step can be deferred by a delta amount of time. The method also can include determining that the window of time has not started and deferring the monitoring step by a delta amount of time.

The determining step can include the thread of execution detecting an interrupt signal from the DUT in response to the trigger during the window of time. The determining step also can include determining that the event was handled during the window of time and purging the time when the trigger was provided to the DUT.

The method further can include determining that the window of time has started. If so, the method can include identifying a stalled processing stage within the DUT and deferring the monitoring step by a delta amount of time, wherein the window of time is extended by approximately the delta amount of time. A determination also can be made as to whether the window of time has elapsed and, if not, the window of time can be decremented by a predetermined amount of time. If it is determined that the window of time has elapsed and that the event was not handled, the method can include indicating the failure to handle the event during the window of time.

Yet another embodiment of the present invention can include a method of verifying event handling for a DUT. The method can include creating a thread of execution within a verification environment corresponding to a trigger intended to cause an event within a DUT, and defining a window of time within which the DUT is to handle the event. The method also can include adjusting the window of time according to external throttling applied to the DUT and monitoring the DUT via the thread of execution to determine whether the event is handled during the window of time.

The method can include defining a start of the window of time according to the time the trigger is introduced into the DUT. The adjusting step can include identifying a stall condition within the DUT and extending the window of time by a predetermined amount of time. The monitoring step can include determining whether an interrupt signal is generated by the DUT in response to the trigger during the window of time.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for verifying event handling using a test and/or verification environment. In accordance with the inventive arrangements disclosed herein, various triggers can be introduced to a device under test (DUT) as input. Each trigger can cause a particular fault condition, or event, to occur within the DUT. To monitor the handling of each event within the DUT, the verification environment can be configured to generate a different thread corresponding to each trigger sent to the DUT. Each thread can be tasked with monitoring the behavior of the DUT in terms of event handling for the particular trigger for which the thread has been created and associated. By creating a different thread for each trigger and/or event, the behavior of the DUT can be monitored and evaluated in a more efficient manner.

Figure 1:
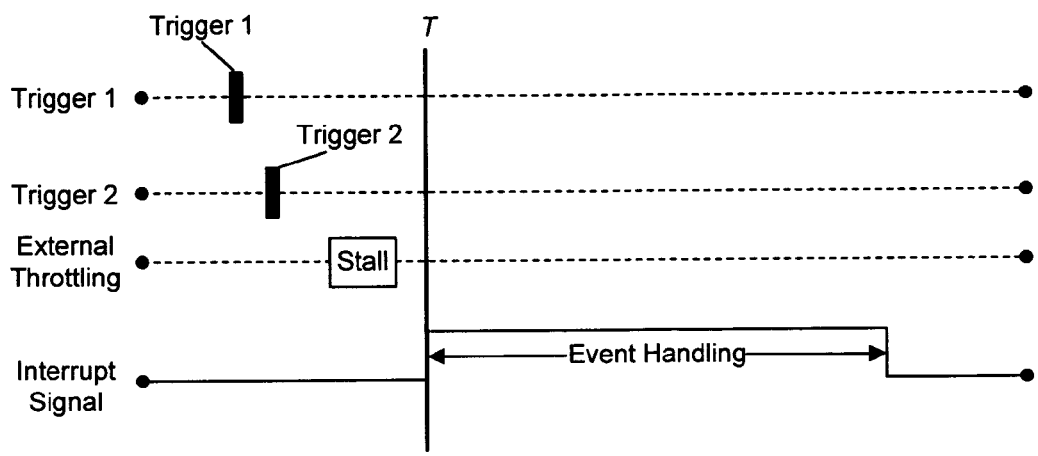
FIG. 1 is a signaling graph illustrating an interaction between a verification environment and a device under test (DUT) involving a plurality of different trigger conditions.
Figure 3:
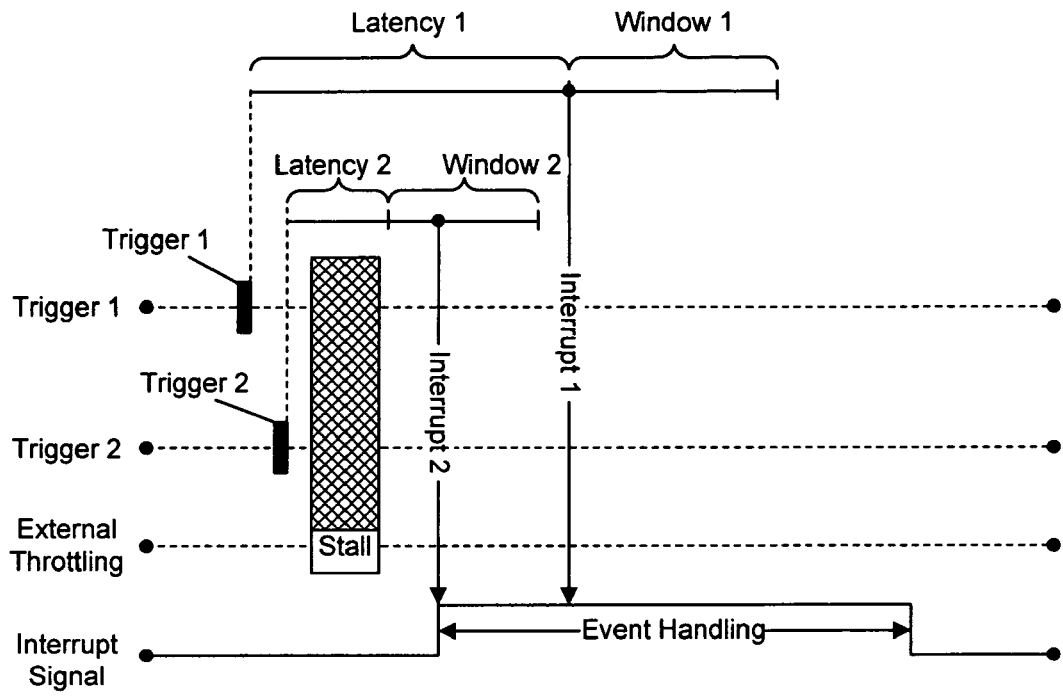
FIG. 3 is a signaling graph illustrating an interaction between a verification environment and a DUT involving a plurality of different trigger conditions in accordance with one embodiment of the present invention.

FIG. 3 is a signaling graph illustrating an interaction between a verification environment and a DUT involving a plurality of different trigger conditions in accordance with one embodiment of the present invention. FIG. 3 illustrates a scenario which is similar to that shown in FIG. 1. In particular, the verification environment has provided two different triggers to the DUT. Further, as illustrated, external throttling has been introduced into the DUT from the test environment. The external throttling causes a stall condition to arise in the DUT just after the introduction of trigger 2.

As noted, the verification environment can be coded in a hardware description language (HDL). In another embodiment, however, the verification environment can be coded in a hardware verification language (HVL) such as OpenVera™, or the like. OpenVera is a concurrent, imperative language designed for writing testbenches which executes in concert with an HDL simulator to provide stimulus to the simulator and observe the results. In any case, it should be appreciated that the particular programming language used to create the verification environment is not intended as a limitation of the present invention.

In one embodiment, the DUT can be a Generic Framing Procedure (GFP) core, such as the GFP core available from Xilinx, Inc. of San Jose, Calif. The Xilinx GFP core implements the International Telecommunication Union's GFP recommendation (G.7041NY.1303). Generally, this core includes a MAP core and an UNMAP core. The MAP core receives client network protocol data on the system interface, encapsulates this data, and transmits the resulting frames on the line interface. The UNMAP core performs a similar process in reverse. The UNMAP core receives encapsulated data on the line interface and de-maps the frames to extract client network protocol data. The network protocol data is, in turn, transmitted on the system interface.

The GFP core is designed to handle several different fault conditions, or events, such as the occurrence of an invalid K character or the occurrence of an Frame Check Sequence (FCS) error. Triggers can be fashioned to cause these events within the GFP core, i.e. by introducing invalid data, or the like, into the GFP core. The occurrence of either one of these events should cause the GFP core to generate an interrupt signal. The GFP core further performs appropriate event handling responsive to the fault condition.

The GFP core also can include a software interface which includes the status register. As noted, the status register can provide error or fault codes to be interpreted in conjunction with the interrupt signal. The software interface can be clocked at a much slower rate than other registers of the GFP core. This difference in clocking can contribute to a delay in event handling, which must be accounted for during verification.

With respect to FIG. 3, the signaling graph shows two different triggers being introduced into the DUT. For example, trigger 1 can correspond to an invalid K character while trigger 2 can correspond to an FCS error. After each trigger is introduced to the DUT, a period of time, referred to as a window, exists for each trigger. During the window, it is expected that the DUT will generate an interrupt signal for the trigger. The interrupt signal should be activated one time for each trigger/event pair. Thus, interrupt 1 should be generated at some time within the time period indicated by window 1. Similarly, interrupt 2 should be generated at some time within the time period indicated by window 2.

The time span represented by each window indicates the amount of time needed to perform several different functions within the DUT. As noted, the window can represent the time needed by the DUT to generate an interrupt responsive to the event caused by the trigger. This time period can include any additional time needed as a result of the inclusion of first-in-first-outs (FIFOs) between processing stages of the DUT. The time span represented by a window also can indicate the amount of time needed by the DUT to perform any event handling that may be necessary as well as the time needed by the device receiving the interrupt to note the interrupt signal and read status register(s) of the DUT that provide additional information concerning the cause or reason for the interrupt.

The window corresponding to each trigger further can be adjusted to accommodate any throttling and associated stalling within the DUT. Thus, if the window lasts for a period of time X and the DUT is stalled for a time of Y, the window can be increased to a time period of X+Y. When determining whether an interrupt was properly generated within a given window of time, the verification environment can adjust the window length according to any stalling introduced by the verification environment into the DUT.

The periods of time preceding each window, indicated by latency 1 and latency 2, illustrate the latencies inherent to the DUT. As noted, these latencies arise from various reasons including, but not limited to, the inclusion of pipelining, FIFOs, and different clocking schemes within the DUT. Apart from the effects indicated already, these latencies also delay the opening of the window during which event handling is expected to occur.

As shown, the DUT activates the interrupt signal responsive to each trigger within the time window specified for the corresponding trigger. Specifically, interrupt 1 is generated within window 1 and interrupt 2 is generated within window 2. This activity can be tracked through the creation of multiple threads. A different thread can be created for each trigger. Accordingly, in this case, a thread can be created for trigger 1 and another thread created for trigger 2. Each thread monitors the event handling corresponding to its associated trigger.

Though the present invention has been illustrated with a GFP core serving as the DUT, it should be appreciated that the present invention is not so limited. Any of a variety of different intellectual property (IP) cores, or other DUTs for that matter, can be used without departing from the spirit of the present invention. Accordingly, the types of triggers and corresponding events can vary according to the particular DUT tested.

Figure 2:
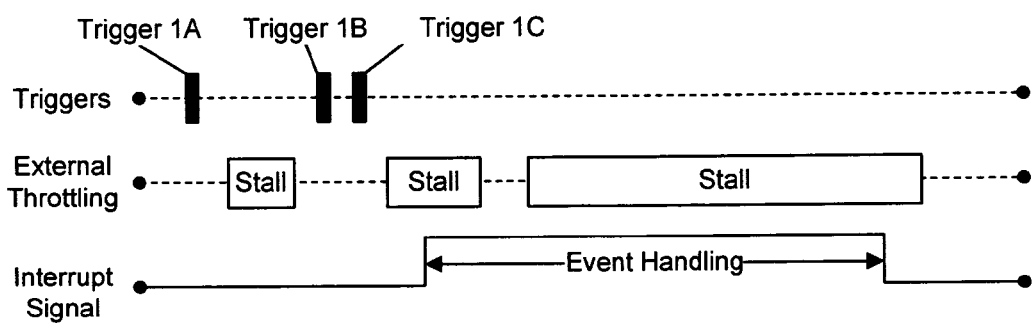
FIG. 2 is a signaling graph illustrating another interaction between a verification environment and a DUT in which several triggers of a same type are introduced over a short interval.
Figure 4:
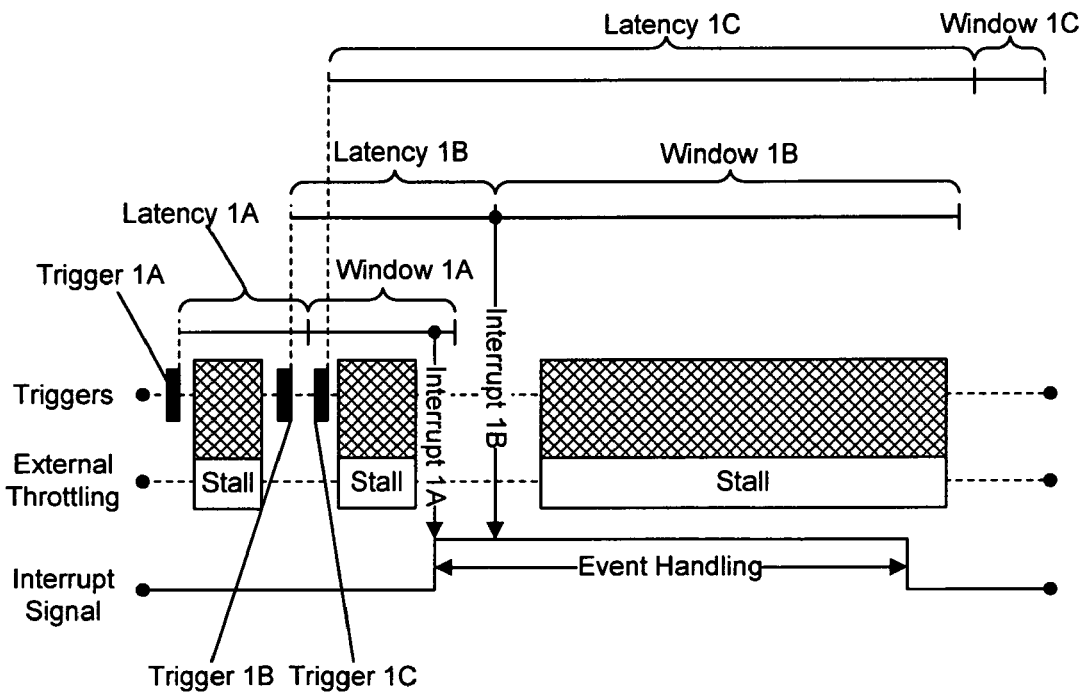
FIG. 4 is a signaling graph illustrating an interaction between a verification environment and a DUT involving a several triggers of a same type in accordance with another embodiment of the present invention.

FIG. 4 is a signaling graph illustrating an interaction between a verification environment and a DUT involving several triggers of a same type in accordance with another embodiment of the present invention. FIG. 4 illustrates a scenario which is similar to that of FIG. 2, where the same type of trigger is introduced into the DUT over a short interval of time. As shown in FIG. 4, triggers 1A, 1B, and 1C are all of the same type and are flagged or identified between periods where the DUT is stalled.

In accordance with an embodiment of the present invention, each of triggers 1A, 1B, and 1C can be associated with its own thread. Before windows 1A, 1B, and 1C open in response to each associated trigger, each window is preceded by a time period shown as latencies 1A, 1B, and 1C. Though threads can continuously monitor for event handling throughout the latency and window periods, in one embodiment, each thread responsible for monitoring event handling can wait during the latency period preceding the window. This can save processing resources as the thread can remain inactive during periods of time in which no event handling is expected to take place. For example, the thread responsible for monitoring event handling for trigger 1A can wait during latency 1A until window 1A begins. The thread can begin monitoring for event handling in response to trigger 1A only after window 1A begins. Monitoring for event handling can end at the conclusion of the window, i.e. window 1A in this example.

Triggers 1A and 1B are handled by the DUT as indicated by the generation of interrupts 1A and 1B within windows 1A and 1B respectively. As discussed, the time spans represented by windows 1A, 1B, and 1C are lengthened by approximately the amount of time the DUT will be stalled. Still, in this case an interrupt signal is not generated for trigger 1C during window 1C. Thus, FIG. 4 illustrates a case in which the DUT fails to assert an interrupt. This situation is identified as each thread that is generated is able to monitor for the generation of an interrupt in response to its associated trigger. Thus in the case of trigger 1C, an error has occurred as the DUT failed to raise an interrupt, and the user should be notified.

The signaling graphs illustrated herein depict DUTs which generate a single interrupt signal. These signaling graphs have been used for purposes of illustration only and, as such, are not intended to limit the present invention. It should be appreciated that the various embodiments disclosed herein can be used to test and/or verify DUTs which generate a single interrupt signal or multiple interrupt signals.

Figure 5:
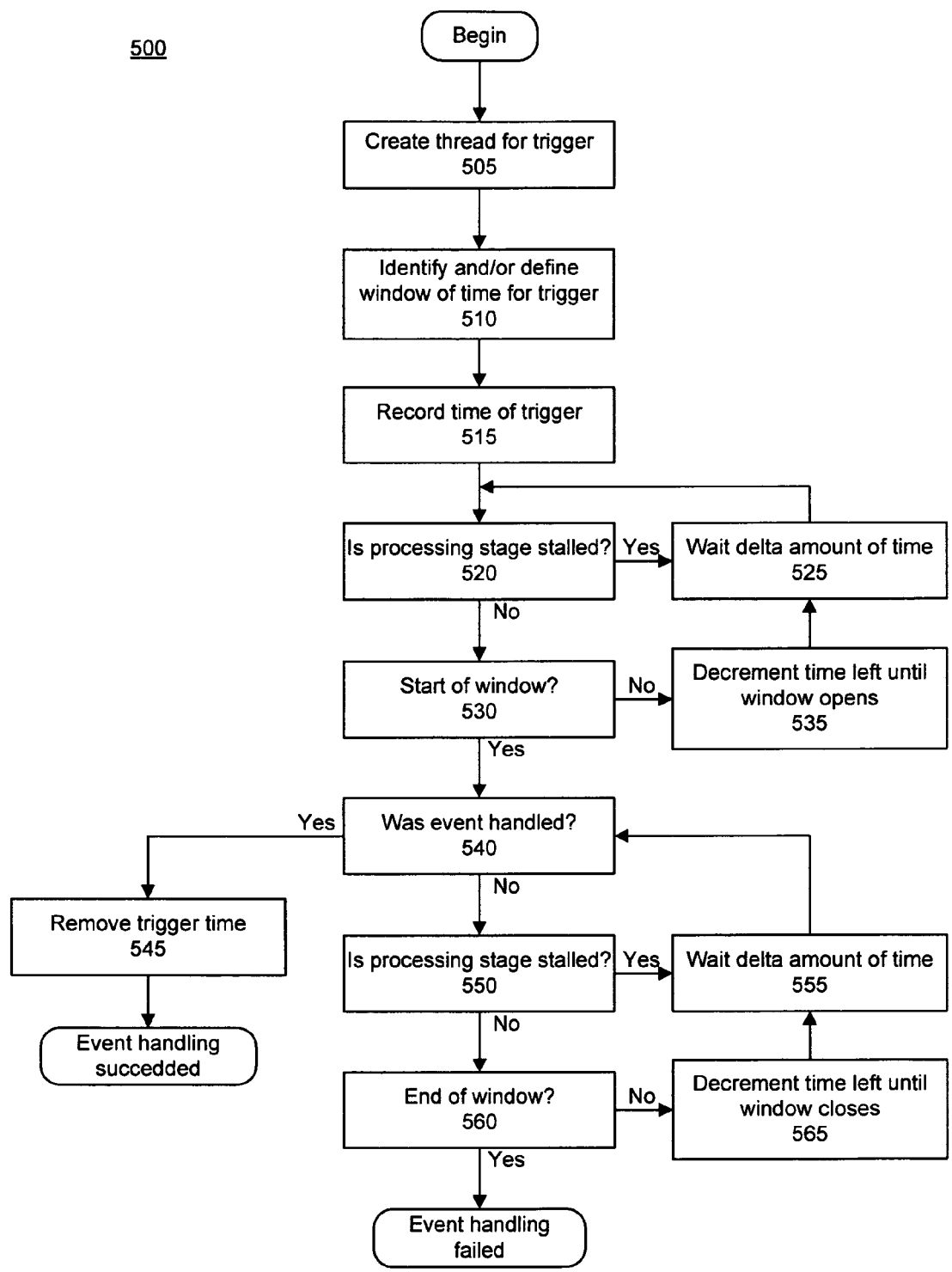
FIG. 5 is a flow chart illustrating a method of event verification in accordance with the inventive arrangements disclosed herein.

FIG. 5 is a flow chart illustrating a method 500 of event verification in accordance with the inventive arrangements disclosed herein. The method can begin in a state where a DUT, such as an IP core, is undergoing verification and/or testing using a verification environment having an appropriate simulator. The verification environment has been configured to send various inputs and triggers to the DUT. As discussed, each trigger can cause a specific fault condition, or event, to occur within the DUT, which necessitates the generation of an interrupt signal by the DUT as well as the implementation of event handling.

Accordingly, in step 505, a thread can be created which corresponds to a trigger being sent, or scheduled to be sent, to the DUT as specified by the verification environment. As the verification environment is programmed to provide triggers at specified times, the threads can be created when the triggers are sent, after being sent, or prior to being sent to the DUT. In any case, one thread can be created for each trigger that is to be provided to the DUT as specified by the verification environment.

In one embodiment, each thread can be forked. In such an embodiment, the threads operate in parallel and are not considered sub-threads of another thread. In step 510, a window of time can be determined and/or identified for the trigger. As noted, the window of time is an estimate of the period of time in which an interrupt signal is expected to be generated in response to the trigger by the DUT. The window of time can be adjusted to accommodate FIFOs internal to the DUT as well as stall conditions which may occur as a result of external throttling applied by the verification environment.

In step 515, the time the trigger is to be sent, or was sent, to the DUT can be recorded by the thread. In one embodiment, the trigger time can be maintained in a list of trigger times stored within the verification environment. In step 520, a determination can be made by the thread as to whether a processing stage within the DUT is stalled. The DUT can be configured to indicate when it is stalled or is attempting to stall. As noted, a processing stage can be stalled as a result of external throttling that is applied to the DUT by the verification environment. Stalling also can occur responsive to other conditions which are not induced by throttling from the verification environment. Regardless of whether stalling is intentionally introduced by the verification environment, a stalling condition can be detected by the thread. If a processing stage is stalled, the method can proceed to step 525. If not, the method can continue to step 530.

In step 525, the thread can wait a delta amount of time before checking the condition of the DUT. In one embodiment of the present invention, the delta amount of time can be an amount of time that is less than the amount of time corresponding to the window of time for the trigger. For example, the delta amount of time can be some fraction of the window of time. Regardless, the delta amount of time can be a predetermined amount of time. Further, each delta time period noted herein need not be the same in duration, but rather can vary or be an approximation of another time period. After step 525, the method can loop back to step 520 to continue monitoring for a stalled processing stage.

Continuing with step 530, in the case where a processing stage in the DUT was not stalled, a determination can be made as to whether the window of time has started. A timer can be used to indicate the expected duration of a latency period preceding the opening of the window of time for the DUT. This latency between the introduction of the trigger and the opening of the window can be estimated from the specification data for the DUT. The specification data further can be used to estimate the duration of the window of time. If the window of time has started, the method can proceed to step 540. If not, however, the method can continue to step 535 where the amount of time left until the window of time opens is decremented. After step 535, the method can proceed to step 525 where the thread waits the delta amount of time prior to continuing to step 520.

In step 540, after it has been determined that the window of time has started, a determination can be made as to whether the event was handled. This determination can be made by identifying, or flagging, when an interrupt signal is generated by the DUT in response to the trigger. In addition, if the DUT provides one or more status registers which provide supplemental information regarding the interrupt signal, such as a code indicating why the interrupt signal was generated, i.e. an event type, such registers can be read.

In any case, if the event was handled, as indicated by the generation of an interrupt signal and/or the presence of any supplemental information as provided by the status register (s), the method can proceed to step 545. As noted, event handling can include, at a minimum, the generation of an interrupt signal within the window of time. In step 545, the trigger time that was recorded can be purged from memory or any list of trigger times that may be maintained by the verification environment. Removal of the trigger time can indicate that event handling within the DUT in response to the trigger was properly handled.

If the event was not handled, the method can proceed to step 550, where the thread can make a further determination as to whether a processing stage within the DUT is stalled. If so, the method can proceed to step 555 where the thread can wait the delta amount of time prior to continuing to monitor the DUT in step 540. If no processing stage within the DUT is stalled, the method can proceed to step 560, where the thread can determine whether the window of time has ended or elapsed. A timer can be used to indicate whether the window of time has elapsed. If the window has not expired, the time left for the window can be decremented in step 565 and the method can continue to step 555 as shown.

If, in step 560 it is determined that the window has expired, event handling within the DUT for the trigger has failed. In that case, the trigger time within the memory can be maintained. Additionally, if so configured, additional data can be stored and associated with the trigger time, such as the trigger type, information relating to stalls within the DUT, and the time the window expired. In any case, the listing of trigger times, at the conclusion of testing, indicates the triggers for which the DUT failed to implement event handling.

Method 500 has been provided for purposes of illustration only. As such, it is not intended as a limitation of the present invention. For example, one or more steps of method 500 can be performed in varying order or can be optional in nature. In illustration, the present invention can indicate those triggers for which event handling did not occur within the DUT. Steps 515 and 545 provide but one manner in which such reporting can take place. Still, the particular technique used to log or track triggers is not intended as a limitation of the present invention as any of a variety of different reports, lists, or the like can be provided. Such reports can indicate triggers for which no event handling took place, triggers for which event handling did take place, or a combination of both.

Further, though method 500 has been described in reference to the operation of a single thread within the verification environment, is should be appreciated that the method can be repeated for a plurality of different threads. As noted, a different thread can be created within the verification environment for each trigger introduced into the DUT. These threads can operate in parallel within the verification environment to monitor the DUT. Each thread monitors for the successful completion of event handling for the trigger and/or event for which the thread was created.

In another embodiment of the present invention, the verification environment, or another software-based analysis tool, can be configured to calculate a trend or average of the time needed for the DUT to implement event handling responsive to a trigger. During verification, the time a trigger is introduced to the DUT can be noted as well as the time when the DUT implements event handling responsive to the trigger. The response times can be graphed for review by test personnel or processed in some other fashion by the tool. In any case, by determining a trend or average for the amount of time between the introduction of a trigger and the start of event handling for the trigger, any event handling which occurs before or after the identified trend or average, for example by a predetermined amount of time, can be identified and reviewed in further detail. Such responses can be labeled as anomalous.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. Within a verification environment, a method of verifying event handling for a device under test comprised of hardware description language logic, said method comprising:
for each trigger specified by the verification environment, creating an associated thread within the verification environment;
identifying a time span during which event handling within a device under test is to be performed responsive to each trigger;
determining whether event handling for each trigger is performed within the time span associated with that trigger, wherein event handling for each trigger is monitored by the thread associated with that trigger; and
if applicable, indicating a trigger that was not handled by the device under test.

2. The method of claim 1, further comprising identifying a time when each trigger is introduced into the device under test, wherein each time span is calculated according to the time when the associated trigger is introduced into the device under test.

3. The method of claim 1, further comprising adjusting the time spans to accommodate external throttling introduced into the device under test by the verification environment.

4. The method of claim 1, further comprising:
determining an average amount of time between the introduction of triggers to the device under test and the start of event handling implemented responsive to the triggers; and
identifying event handling, implemented responsive to a trigger, which begins more than a minimum amount of time before or after the average amount of time as measured from the introduction of the trigger to the device under test.

5. The method of claim 1, said determining step further comprising judging whether an interrupt signal is generated during the time span for each trigger.

6. The method of claim 5, said determining step further comprising judging whether a status register associated with the interrupt signal provides valid data.

7. Within a verification environment, a method of verifying event handling for a device under test, said method comprising:
creating a thread of execution within the verification environment corresponding to a trigger;
recording a time when the trigger is provided to the device under test;
monitoring the device under test, via the thread of execution, during a window of time associated with the trigger, wherein the window of time is calculated according to the time the trigger is provided to the device under test; and
determining whether an event caused by the trigger within the device under test is handled during the window of time.

8. The method of claim 7, further comprising indicating whether the event caused by the trigger was handled within the window of time.

9. The method of claim 7, further comprising:
identifying a stalled processing stage within the device under test prior to a start of the window of time; and
deferring said monitoring step by a delta amount of time.

10. The method of claim 7, further comprising:
determining that the window of time has not started; and
deferring said monitoring step by a delta amount of time.

11. The method of claim 7, said determining step further comprising:
determining that the event was handled during the window of time; and
purging the time when the trigger was provided to the device under test.

12. The method of claim 7, further comprising determining that the window of time has started.

13. The method of claim 12, further comprising:
identifying a stalled processing stage within the device under test; and
deferring said monitoring step by a delta amount of time, wherein the window of time is extended by approximately the delta amount of time.

14. The method of claim 12, further comprising:
determining whether the window of time has elapsed; and
if not, decrementing the window of time by a predetermined amount of time.

15. The method of claim 12, further comprising:
determining that the window of time has elapsed and that the event was not handled; and
indicating the failure to handle the event during the window of time.

16. The method of claim 7, said determining step further comprising the thread of execution detecting an interrupt signal from the device under test in response to the trigger during the window of time.

17. A method of verifying event handling for a device under test comprising:
creating a thread of execution within a verification environment corresponding to a trigger intended to cause an event within a device under test;
defining a window of time within which the device under test is to handle the event;
adjusting the window of time according to external throttling applied to the device under test; and
monitoring the DUT via the thread of execution to determine whether the event is handled during the window of time.

18. The method of claim 17, further comprising defining a start of the window of time according to the time the trigger is introduced into the device under test.

19. The method of claim 17, said adjusting step further comprising:
identifying a stall condition within the device under test; and
extending the window of time by a predetermined amount of time.

20. The method of claim 17, said monitoring step further comprising determining whether an interrupt signal is generated by the device under test in response to the trigger during the window of time.

* * * * *